(12) United States Patent
Mallinson

(10) Patent No.: US 8,453,097 B2
(45) Date of Patent: May 28, 2013

(54) SYSTEM AND METHOD FOR SERIES AND PARALLEL COMBINATIONS OF ELECTRICAL ELEMENTS

(75) Inventor: A. Martin Mallinson, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 0 days.

(21) Appl. No.: 13/414,522

(22) Filed: Mar. 7, 2012

(65) Prior Publication Data

US 2012/0246607 A1  Sep. 27, 2012

Related U.S. Application Data

(60) Provisional application No. 61/466,421, filed on Mar. 22, 2011.

(51) Int. Cl.
*G06F 17/50* (2006.01)
(52) U.S. Cl.
USPC .............. 716/132; 716/100; 716/110

(58) Field of Classification Search
None
See application file for complete search history.

(56) References Cited

U.S. PATENT DOCUMENTS

| | | | |
|---|---|---|---|
| 5,790,334 | A | 8/1998 | Cunningham |
| 5,946,211 | A | 8/1999 | Glover |
| 6,751,784 | B2 | 6/2004 | Du et al. |
| 6,848,092 | B2 | 1/2005 | Jaska et al. |
| 7,671,770 | B2 | 3/2010 | Tukel |

*Primary Examiner* — Leigh Garbowski
(74) *Attorney, Agent, or Firm* — Gard & Kaslow LLP

(57) ABSTRACT

A method and system for generating and matching complex series and/or parallel combinations of nominally identical initial elements to achieve compound values having constant ratios to the initial elements and to each other is disclosed. The ratios between compound values can be held constant to almost any desired degree of accuracy, with potential errors greatly reduced from those typical in the construction of individual elements of different values. Since the initial elements are nominally identical, the ratios between values depend primarily upon the connections of the initial elements, rather than their geometry, and thus remain virtually constant regardless of variations in the manufacturing process.

19 Claims, 5 Drawing Sheets

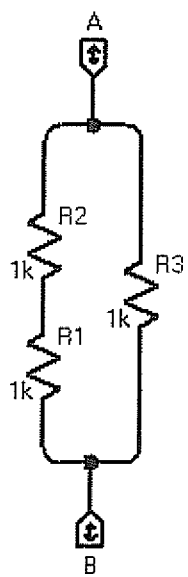
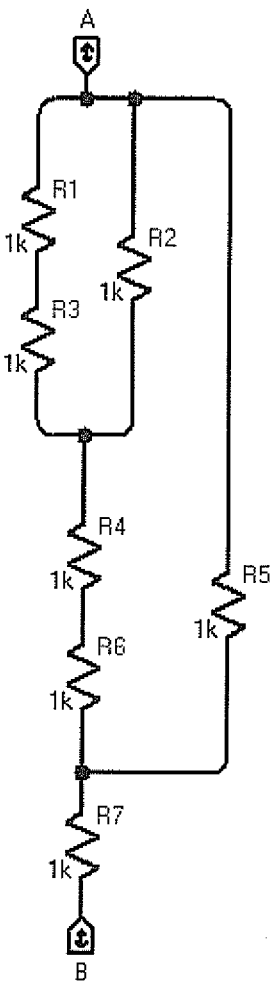
Figure 1
Figure 2

SYSTEM AND METHOD FOR SERIES AND PARALLEL COMBINATIONS OF ELECTRICAL ELEMENTS

This application claims priority from Provisional Application No. 61/466,421, filed Mar. 22, 2011, which is incorporated by reference in its entirety.

FIELD OF THE INVENTION

The present invention relates generally to the design of electronic circuits. More specifically, the invention relates to methods for implementing component values in semiconductor circuits.

BACKGROUND OF THE INVENTION

Semiconductor circuits formed on semiconductor chips, or wafers, include a number of types of circuit elements, including, for example, resistors, capacitors, inductors, transistors, etc. These elements must be created on the semiconductor chip in a way that the value or performance of the element meets the requirements of the circuit in which they are included.

Any semiconductor material has certain characteristics, and some of these characteristics are such that an element constructed on the semiconductor will have a certain value that depends in whole or part upon the area occupied by the element. A number of elements, including resistors, capacitors and inductors, are thus typically created as geometric shapes of a size that, given the characteristics of the semiconductor, will result in a particular value specified by a desired circuit design.

For example, suppose a semiconductor has a sheet resistance of 300 ohms per square, i.e., when a current flows through an area of 1 micron by 1 micron on the semiconductor surface it is subjected to a resistance of 300 ohms ($\Omega$). A resistor constructed with a width of 1 micron and a length of 10 microns would thus be expected to have a resistance of 3000$\Omega$ (or 3 kilohms (k$\Omega$); 1000$\Omega$=1 k$\Omega$) since the current through the resistor flows through ten squares along the length of the resistor.

However, this expectation is based upon certain assumptions that often prove to be incorrect. For example, the physical dimensions of an element are susceptible to errors or variations in the manufacturing process, which may not be able to reliably or repeatedly make the precise dimensions determined to yield the desired value for the resistor. Suppose that a 3 k$\Omega$ resistor is desired, and that the actual dimensions of the desired 1 micron by 10 micron resistor vary by 0.03 microns in each direction. Depending upon the direction of such a variation, in one case the actual resistor may be 0.97 microns wide and 9.97 microns long, for a total area of 9.6709 squares and an actual resistance of 2901.27$\Omega$, a variation of over 3 percent. Alternatively, the resistor may be 1.03 microns wide and 10.03 microns long, for a total area of 10.3309 squares and a resistance of 3099.27$\Omega$, similarly over 3 percent different than the desired value. If the length and width vary by less than 0.03 microns, or the variations are in opposite directions, still other resistances in between these extremes will be obtained.

In addition to this problem of obtaining a precise absolute value for a resistor, it is sometimes even more desirable to obtain a precise ratio between the values of two resistors. For example, consider a case where a ratio of resistances of 1 to 1.7273 is needed. This can be achieved in theory in the conventional manner by constructing two resistors on the chip, one 1 micron wide and 10 microns long, and the other 1 micron wide and 17.273 microns long.

But suppose that due to the manufacturing process these dimensions are all eroded by 0.1 micron. The first resistor will be 0.9 microns long by 9.9 microns wide for an area of 8.91 squares, and the second resistor will be 0.9 microns long by 17.173 microns wide, for an area of 15.4557 squares. The resulting ratio between the two resistors is now 1.7346, rather than the desired 1.7273, an error of just over −0.42 percent. While this may seem small, such an error may be enough to degrade the accuracy or performance of the circuit on the semiconductor chip.

In addition, the resistance of a resistor may vary from what is expected due to variations in the "body resistance" of the material. This is typically due to variations in the thickness of the silicon layers used to make the resistors, as well as variations in the amount of doping material that is implanted in the silicon when manufacturing the resistors.

Still further, in building elements on a semiconductor chip, it is necessary to make connections to the material. For example, to build a poly-silicon resistor on a chip there must be contact holes, and sometimes different doping levels at each end, for the metal traces to make good contact. The contact holes and associated features introduce an "end effect," which is typically an unwanted additional resistance in series with the intended resistance, and is thus to be added to the value of the resistance as designed. This additional resistance generally depends largely upon how accurately the contact holes are cut in the chip material; it also creates a difference or error from the desired value, creating a resistance higher than intended, and makes it hard to match dissimilar values precisely since the unwanted end effect resistance may not be precisely known.

Again, suppose that it is desired to build two resistors with a ratio of 1 to 1.7273, with one resistor being 1 k$\Omega$ and the other being 1.7273 k$\Omega$ Even if the resistors are built to the precise size to yield these values, if the "end effect" adds, for example, 100$\Omega$ to each value, then the ratio between what are effectively a 1.1 k$\Omega$ resistor and a 1.8273 k$\Omega$ resistor becomes 1.6612 rather than the desired 1.7273, an error of almost 4 percent. Again, this may significantly alter the desired performance of the circuit.

Still another issue is that the chip design process typically includes a "place and route" stage. This is typically performed automatically by software, and, as implied by the name, is composed of two steps, placement and routing. The first step, placement, involves deciding where the components in the circuit should be "placed" or located in what is generally a limited amount of space on the chip. This is followed by routing, in which it is determined where to locate the connections needed between the placed components. The routing step is intended to implement all the desired connections while following the rules and limitations of an intended manufacturing process.

The place and route steps are interrelated, as the location of the elements as determined by the placement step has subsequent effects upon the ability of the routing step to determine the connections between the elements. Thus, determining the optimum locations of the elements and their connections can be very complex in circuits with many elements of differing size.

These issues make it difficult to implement elements on semiconductor chips having precise values, and more specifically to implement multiple elements with precise ratios between their values.

SUMMARY OF THE INVENTION

A method and system is disclosed for generating complex series and/or parallel combinations of nominally identical initial elements to achieve arbitrary non-trivial compound values. Combinations built as disclosed herein maintain the ratio between a compound value and the value of the initial element, and thus between two compound values as well, nearly constant to a high degree of accuracy regardless of variations in the manufacturing process.

In one embodiment, a method of designing semiconductor circuit components having nominal values in a desired ratio to each other is disclosed, each component constructed as a combination of a number of repeated identical elements, the method comprising: receiving as an input at a computing device a first desired value for a first component and a second desired value for a second component; calculating by the computing device the ratio between the desired values for the first component and the second component; receiving as an input at the computing device the number of repeated identical elements to be used in each component; determining by the computing device the possible combinations of series and parallel connections of the received number of repeated identical elements; calculating by the computing device a value for each combination based upon a unity value for the repeated identical elements; identifying by the computing device two combinations from the determined combinations that have the desired ratio between the determined values; and calculating an actual value for the repeated identical elements that, when multiplied by the calculated values of the selected two combinations, results in the received values for the first component and the second component.

In another embodiment, a method of designing semiconductor circuit components having nominal values in a desired ratio to each other is disclosed, each component constructed as a combination of a number of repeated identical elements, the method comprising: receiving as an input at a computing device a first desired value for a first component and a second desired value for a second component; calculating by the computing device the ratio between the desired values for the first component and the second component; receiving as an input at the computing device a first element value indicating the number of repeated identical elements to be used in the first component and a second element value indicating the number of repeated identical elements to be used in the second component; determining by the computing device the possible combinations of series and parallel connections of the number of repeated identical elements of the first element value and the number of repeated identical elements of the second element value; calculating by the computing device a value for each combination based upon a unity value for the repeated identical elements; identifying by the computing device a combination for the first component from the determined combinations of the first element value and a combination for the second component from the determined combinations of the second element value, such that the combination for the first component and the combination for the second component have the desired ratio between the determined values; and calculating an actual value for the repeated identical elements that, when multiplied by the calculated values of the selected two combinations, results in the received values for the first component and the second component.

Yet another embodiment discloses a method of designing semiconductor circuit components having nominal values in a desired ratio to each other, each component constructed as a combination of a number of repeated identical elements, comprising: receiving as an input at a computing device a plurality n of values for the circuit components and a desired maximum margin of error; determining by the computing device, from the plurality of values received for the circuit components, a nominal value for the repeated identical elements; receiving as an input at the computing device the number of repeated identical elements to be used in each component; determining by the computing device the possible combinations of series and parallel connections of the received number of repeated identical elements; calculating by the computing device a value for each combination based upon a unity value for the repeated identical elements; selecting by the computing device a set of one or more combinations as an initial assumption of the combinations to be used to construct the desired components; calculating by the computing device the root mean square error between the ratios of the values of the set of selected combinations and the ratios of the desired values of the components; repeatedly replacing by the computing device one or more of the selected combinations with other combinations to create a new set of selected combinations and calculating the root mean square error between the values of the new set of selected combinations and the desired values of the components; and identifying by the computing device a set of combinations for which the root mean square error is either within the desired maximum margin of error or the lowest error that can be found.

Another embodiment discloses a system for designing semiconductor circuit components having nominal values in a desired ratio to each other, each component constructed as a combination of a number of repeated identical elements, the system comprising: input means for receiving a first desired value for a first component and a second desired value for a second component and receiving as an input the number of identical elements to be used in each component; a processor configured to: calculate the ratio between the desired values for the first component and the second component; determine the possible combinations of series and parallel connections of the selected number of repeated identical elements; calculate a value for each combination based upon unity value for the repeated identical elements; identify two combinations from the determined combinations that have the desired ratio between the determined values; and calculate an actual value for the repeated identical elements that, when multiplied by the calculated values of the selected two combinations, results in the received values for the first component and the second component; a memory for storing data representing each of the determined combinations of repeated identical elements and the value of each combination; and output means for outputting the identified two combinations and calculated actual value of the identical elements.

Still another embodiment discloses a non-transitory computer readable storage medium having embodied thereon instructions for causing a computing device to execute a method of designing semiconductor circuit components having nominal values in a desired ratio to each other, each component constructed as a combination of a number of repeated identical elements, the method comprising: receiving as an input at a computing device a first desired value for a first component and a second desired value for a second component; calculating by the computing device the ratio between the desired values for the first component and the second component; receiving as an input at the computing device a first element value indicating the number of repeated identical elements to be used in the first component and a second element value indicating the number of repeated identical elements to be used in the second component; determining by the computing device the possible combinations of series and parallel connections of the number of repeated identical elements of the first element value and the number of repeated identical elements of the second element value; calculating by the computing device a value for each combination based upon a unity value for the repeated identical elements; identifying by the computing device a combination for the first component from the determined combinations of the first element value and a combination for the second component from the determined combinations of the second element value, such that the combination for the first component and the combination for the second component have the desired ratio between the determined values; and calculating an actual value for the repeated identical elements that, when multiplied by the calculated values of the selected two combinations, results in the received values for the first component and the second component.

BRIEF DESCRIPTION OF THE DRAWINGS

FIG. 1 shows one possible combination of three resistors.
FIG. 2 shows one possible combination of seven resistors.

DETAILED DESCRIPTION OF THE INVENTION

Figure 3:
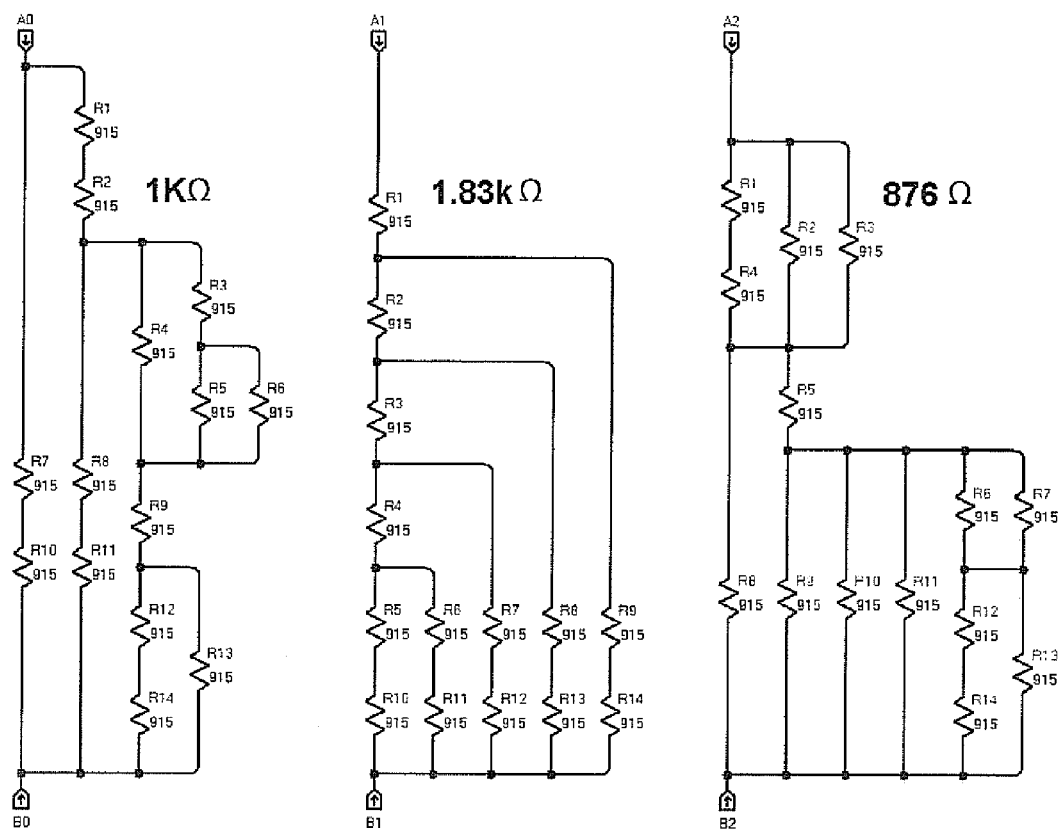
FIG. 3 shows three possible combinations of fourteen resistors.

The present application describes a method and system for generating complex series and/or parallel combinations of nominally identical initial elements to achieve arbitrary non-trivial compound values. Further, the ratio between a compound value and the value of the initial element, and thus between two compound values as well, remains nearly constant regardless of variations in the manufacturing process. Using the techniques described herein, a chip designer can implement a methodology of element matching that does not depend on precise geometric differences of the elements, which can vary in manufacturing as above, but rather depends only on their connectivity.

In the described method, an algorithm generates parallel and series combinations of a plurality of similar initial two-terminal elements to create a two-terminal compound element having a fixed impedance relationship to the initial two-terminal element. For example, if the initial element is a resistor of 1 kΩ, the algorithm configures series and parallel combinations of multiple instances of the 1 kΩ resistor to build compound elements having different resistance values. The value of the initial element may be selected so that the actual values of the compound elements are what is desired by a circuit designer. The algorithm is able to handle trivial cases of small numbers of elements that may be easily visualized by a designer, as well as much more complex cases involving larger numbers of elements that would take much longer to analyze.

It is well known that the connection of multiple elements having impedance in series and/or parallel connections results in an equivalent impedance that may differ from the impedance of any of the elements; for example, it is apparent to those of skill in the art that three 1 kΩ resistors make an effective resistance of 3 kΩ when placed in series, or make 333.3Ω when placed in parallel. However, other combinations are not apparent; a designer is unlikely to know how to connect an arbitrary number of resistors, such as 14, of 1 kΩ each in a configuration that results in a resistance of 4.567 kΩ, without spending some significant amount of time to design such a configuration.

The method described herein allows one to precisely control the ratios between components of different values, without having to rely on the ability to make each of the components to a precise value. This is done by using nominally identical elements and constructing at least one of the components as a complex series and/or parallel connection scheme of a given number of the identical elements; any arbitrary value may be obtained for the components, within certain limits. The method works for all cases, both the trivial ones where the elements are all in series or all parallel and thus may be expressed as simple integer ratios (1:3 or 3:1 as above, etc.), as well as for any other non-trivial cases, and can determine combinations that result in arbitrary values.

The matching of combinations of elements having different values built in way is much improved over the current art. As above, the prior art method of varying the physical dimensions of elements to achieve different values is susceptible to errors in precisely manufacturing the desired dimensions on the chip, such that the value of any given element, and thus the ratio of two elements, may not be what is expected or desired.

By contrast, the described method does not suffer the same systematic error from dimensional inaccuracy, because it uses the same nominally identical elements each time. Also, since a combination will typically occupy more area on the chip than a single element, any variations in the manufacturing process are more likely to even out over the greater area, reducing the impact of such variations on the value of the combination as compared to variations in the value of an individual element. Thus, even if the dimensions are not precise, each element, and thus each combination of elements, will generally suffer the same systematic variation in the process, and the ratio of the values of a combination of elements to the basic element, or between two combinations of elements, will be preserved.

Similarly, in the methodology described here, the "end effects" described above that add resistance will generally contribute significantly less error than in the prior art. This is because such effects will generally be randomly spread across a greater number of the nominally identical elements, and are thus less likely to cause significant variations than in the case of two individual elements. Thus, while the total resistance of an individual element or a combination may change as any end effect resistance changes, the ratio, which as above is often more important than the absolute value, will not change by much, if at all.

Another benefit of using identical elements is that an automatic place and route software tool can more easily place and connect the complex series and/or parallel elements on the chip. This is because each element, such as a resistor or other component, is the same nominally identical element used over and over again; all combinations use the same element of the same shape, differing only it connectivity, and this fits well into the place and route tool methodology. The potentially tedious process of designing the layout of a chip is thus made less complex and more convenient by the use of series and/or parallel connections of nominally identical elements as described herein.

Two electrical elements, for example, resistors, inductors, or capacitors, may be connected in series or in parallel. It is well known that the effective value of such a series or parallel combination of two elements of the same type will differ from the value of either element. For example, the equation describing the effective resistance $R_s$ of a series connection of resistances $R_1$ and $R_2$ is:

$$R_s = R_1 + R_2$$

while the effective resistance $R_P$ of the parallel connection of $R_1$ and $R_2$ is:

$$R_P = \cfrac{1}{\cfrac{1}{R_1} + \cfrac{1}{R_2}}$$

Thus, if two resistors of the same value are connected in series, the resistances add and the series combination yields twice the resistance of each element. If the two resistors are connected in parallel, the effective resistance will be half of the resistance of each element.

The values of inductors in series and parallel are determined in the same way as resistors, but capacitances are the opposite. Thus, two capacitors $C_1$ and $C_2$ in parallel result in an effective capacitance $C_S$ given by:

$$C_P = C_1 + C_2$$

while the effective capacitance of the two capacitors $C_1$ and $C_2$ in series is given by:

$$C_S = \cfrac{1}{\cfrac{1}{C_1} + \cfrac{1}{C_2}}$$

For ease of reference, resistors are generally referred to herein, it being understood that the described method and apparatus may also operate on inductors and capacitors as well.

More elements will permit more combinations, even if all of the elements are substantially identical and have the same nominal value. Thus, three resistors may be connected all in series, all in parallel, or with two resistors in series, and the two resistors in series then in parallel with the third resistor. This last situation is shown in FIG. 1, where resistors $R_1$ and $R_2$ are in series, and resistor $R_3$ is in parallel with the combination of $R_1$ and $R_2$. (If the resistors are all of the same value, it does not matter which resistor is designated as $R_1$, $R_2$, or $R_3$.)

Four resistors results in more possible combinations; all four resistors may be in series, all four in parallel, three in series and that series in parallel with the last resistor, or two pairs of two resistors each in series and the two series in parallel with each other. Five resistors will result in still more combinations, and so on. For example, FIG. 2 shows one possible combination of seven resistors.

With respect to FIG. 1, if each resistor is 1 kΩ, from the equations above it can be seen that the combination of $R_1$ and $R_2$ results in an effective resistance of 2 kΩ, and placing these two resistors with a combined resistance of 2 kΩ, in parallel with the third 1 kΩ resistor $R_3$ results in an effective resistance of 666.67Ω for the combination of FIG. 1.

Similarly, the equations above can be used to calculate the value of the resistor combination of FIG. 2. Again, if each resistor is 1 kΩ, from FIG. 1 the effective value of resistors $R_1$, $R_2$, and $R_3$ is 666.67Ω. Adding resistors $R_4$ and $R_6$ in series with resistors $R_1$, $R_2$, and $R_3$ results in 666.67Ω+2 kΩ=2.6671 kΩ. Placing this amount of resistance in parallel with the 1 kΩ of $R_5$ results in an effective resistance of 727.3Ω. Finally, adding the 1 kΩ of $R_7$ to the effective resistance of 727.3Ω of resistors $R_1$ to $R_6$ gives an effective resistance of 1.7273Ω for the combination of FIG. 2.

As was mentioned above, one way of creating a ratio of 1 to 1.7273 between two resistance values is to build two resistors having that ratio between their area, for example, one resistor 1 micron wide and 10 microns long, and the other 1 micron wide and 17.273 microns long. Also as above, errors in precision in manufacturing may change the value of each resistor and thus the ratio between them.

Another way of creating a ratio of 1 to 1.7273 between two resistance values will be seen from FIG. 2. A first resistor of 1 kΩ may be made, and then, rather than changing the shape to make the second resistor, a combination of seven 1 kΩ resistors that are identical to the first resistor may be made as shown in FIG. 2 (or as nearly identical as possible given the manufacturing process).

The ratio between the 1 kΩ resistor and the 1.7273 kΩ resistor combination of FIG. 2 will remain at 1.7273 regardless of any erosion or expansion of the area of a 1 kΩ resistor in manufacturing, since all of the resistor shapes are identical and will experience similar erosion or expansion. The ratio is derived from the connection of the resistors in the combination of FIG. 2, rather than from any attempt to adjust the lengths or widths of the individual resistors.

Similarly, since the "end effect" will be the same for each resistor, the resistance added to each resistor will be the same, and thus the ratio will again be preserved, as in the case above where the area of each resistor changes in manufacturing. For this reason, using combinations of identical resistors to make the desired ratios is relatively immune from both geometric errors and contact resistance at the resistor ends, and is a better way to match resistors on a semiconductor chip.

It can be confirmed from the formulas above that if the nominal value of the repeated resistor changes, then the value of each combination of such resistors changes by the same percentage, so that the ratio remains the same. For example, if each resistor in FIG. 1 is changed by 10 percent, from 1 kΩ to 900Ω, the value of the combination changes from 667Ω to 600Ω, also a change of 10 percent. Similarly, if each resistor is changed by 50 percent, to 500Ω, the value of the combination changes by 50 percent, to 333.33Ω. Similar calculations will show that the same is true of the combination of FIG. 2, or any other combination of nominally identical resistors.

As above, a manufacturing process may have variations which make building an individual element having precise dimensions and a specific value difficult; however, in general it is expected that any such variations will themselves remain at least approximately constant across the small size of a particular circuit on a semiconductor chip. Thus, any nominally identical elements on the chip will have identical, or nearly identical, variations from the intended shape and value, and the ratio between all such elements, or their combinations, will remain constant to a much greater degree than if an attempt is made to build each element to a desired value as in the prior art.

FIG. 3 shows another example of three resistor combinations. Suppose that a circuit requires three resistor values, that it is desired that the nominal values of the three resistors are to be 1 kΩ, 1.83 kΩ and 876Ω, and that the ratios between the three resistors are critical. It would be difficult to make three individual resistors with the correct lengths and widths to insure that the ratios between the resistors remain constant, given the variations in a manufacturing process described above.

However, instead of trying to make three resistors in precisely these amounts, a standard resistor may be used to create three combinations of 14 resistors each as shown in FIG. 3. Using the formulas above, it is easily apparent to one of skill in the art that if the standard resistor is assigned a unity value, the second combination has a value of 2, so that the effective resistance of the combination is double that of the standard resistor. Thus, for example, if each resistor has a value of 1Ω, the second combination would have an effective resistance of 2Ω. It can also be confirmed by applying the serial and parallel resistance formulas above that for unity resistor values the first and third combinations have effective values such that all three combinations have the desired ratios of 1 to 1.83 to 0.876. Thus, to allow the second combination to have an effective resistance of 1.83 kΩ, each resistor should have a nominal value of 1.83 kΩ (the desired resistance) divided by 2 the value of the second combination), or 915Ω. Again using the formulas above, it may also be seen that when each resistor has a nominal value of 915Ω, the first combination has an effective resistance of 1 kΩ, and the third combination has an effective resistance of 876Ω, and the three combinations are thus in the desired ratios.

If these three combinations are made on a single chip, all 52 resistors shown in FIG. 3 will be identical or nearly so, as again it is expected that any variations in the manufacturing process will be nearly constant across the single circuit in which the three combinations are implemented. Even if there are errors in the manufacturing process that cause the nominal value of each resistor to change to, for example, 900Ω, the ratios between the three resistor combinations will remain nearly constant.

In order to understand and use the complex series and/or parallel configurations of repeated elements contemplated herein, it is helpful to have some way of representing such structures mathematically as well as pictorially. The algorithm described herein uses an algebraic notation that has been developed which allows such configurations to be expressed mathematically, as well as allowing a software language to operate on such expressions.

The algorithm uses prefix notation with two defined operators. One operator is "s" representing series connection of elements, and the other operator is "p" representing parallel connection of elements. Each operator accepts any arbitrary number of operands.

As will be understood by those of skill in the art, considered as data, an "s" or "p" expression is a list structure, the first item of the list being the operator and successive items being the operands. Operands are evaluated froth left to right, and any list operands are recursively evaluated. Thus, as one example, the expression $$(s2(p3))$$

is a list of three items, "s," "2," and "(p 3)." The first item of the list is "s," the operator. The second item "2" is the first argument to "s," and the third item, "(p 3)" is the second argument to and is itself a list.

The arguments to the "s" and "p" operators are operands that are either other expressions of "s" and "p" or non-zero cardinal numbers representing the number of repeated elements to which the operator is to be applied. For example, the expression "(s 4)" represents the "s" or series operator applied to a single argument, the cardinal number 4, representing four repeated elements. Evaluation of "(s 4)" by the evaluator defined above results in the number 4, and thus in four elements being placed in series.

Figure 4:
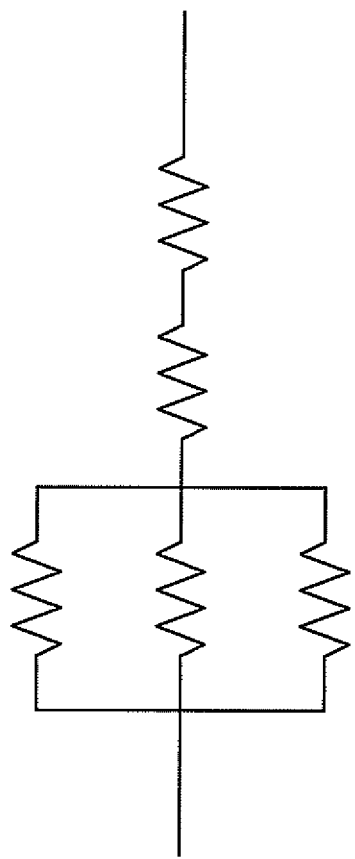
FIG. 4 shows one possible combination of five resistors.

As another example, the expression "(s 2 (p 3))" represents the "s" series operator applied to two arguments. The first argument is the cardinal number 2, representing two repeated elements to be placed in series. The second argument is "(p 3)," representing the "p" parallel operator applied to the cardinal number 3, representing three repeated elements to be placed in parallel, and this parallel configuration to then be placed in series with the other two elements. The resulting configuration is shown in FIG. 4.

This recursive analysis may be repeated as often as necessary. Thus, to construct an expression representative of the series or parallel combination of any other two expressions is equivalent to repeatedly constructing a list of three items, the first item being "s" or "p," the second item being the first of the two expressions, and the third item being the other expression.

For example, if two structures A=(s 4) and B=(s 2 (p 3)) are to be constructed in parallel, the list "(p A B)" is created, and may be written as:

$$(p(s(s4)(s2(p3)))$$

Similarly, the series combination is "(s A B)" or:

$$(s(s4)(s2(p3)))$$

It may also be seen that simplification is sometimes possible. For example, in the last series combination, since A contains four elements in series and is itself in series with B, which contains two more elements in series, the expression may be simplified to:

$$(s6(p3))$$

As further examples of this notation, the three resistor combination of FIG. 1 is represented as (p 1 (s 2)), since two resistors $R_1$ and $R_2$ are in series, and that combination is then in parallel with another resistor $R_3$. The combination of FIG. 2 contains the same resistors $R_1$ to $R_3$; adding resistors $R_4$ and $R_6$ in series with these results in:

$$(s2(p1(s2)))$$

Putting this combination in parallel with resistor $R_5$ yields the expression:

$$(p1(s2(p1(s2))))$$

Finally, adding resistor $R_7$ to this combination results in the overall expression for FIG. 2 of:

$$(s1(p1(s2(p1(s2)))))$$

Expressions may be similarly derived to represent the combinations of FIG. 3. The expression for the 1 kΩ combination is:

$$(p(s2)(s2(p2(s1(p1(s2))(p1(s1(p2))))))$$

For the 1.83 kΩ resistor, the expression is:

$$(s1(p(s2)(s1(p(s2)(s1(p(s2)(s1(p(s2)(s2)))))))))$$

The 876Ω resistor is represented by:

$$(s(p2(s2))(p1(s1(p3(s(p2)(p1(s2))))))$$

For any number of elements, it is thus relatively straightforward to determine all of the possible serial and parallel connections that may be made between them, although it becomes tedious and time consuming to do so as the number of elements increases. For 1 element, there is of course only one configuration. Two elements results in two combinations, placing the elements either in series or in parallel with each other. Three elements may be all in series or all in parallel, or two elements may be in series with each other and then in parallel with the third, as shown in FIG. 1.

For greater numbers, one way of determining all possible combinations of n elements is to first determine all of the combinations of elements for a number less than n and then putting these combinations in all possible combinations with the remaining elements. Thus, for n=4, all combinations of three elements can be determined, and then the fourth element put in series or parallel with each of those combinations. Similarly, all combinations of two elements can be put in series or parallel with all combinations of two elements. By starting with n=1 and proceeding in this way, all combinations may be determined for any value of n.

However, it will be appreciated that the number of combinations grows exponentially, so that in the case of n=16, there are approximately 600,000 possible combinations. Thus, in order to effectively determine and fuse combinations of more than a very few elements, it is useful to implement the construction and evaluation of such combinations of elements in software and have a processor perform the calculations.

In one embodiment, the method and algorithm described herein are implemented in a program written the LISP programming language. The "s" and "p" operators may be expressed as S-expressions in LISP. S-expressions in LISP are homoiconic, so that the operators may be viewed as either operators or as data, and the algorithm uses this property to generate all series and/or parallel combinations of the repeated element by operating on "s" and "p" expressions as data structures where appropriate.

In one embodiment, a number of elements to be used in each combination is selected, for example by a circuit designer, and then as above all possible combinations of that number of elements are determined. One possible embodiment of code to implement this in software is as follows:

```
(defun series-parallel-values (&optional (n 12))
        (declare (optimize (speed 3)))
1       (flet ((join
2              (f x y)
3              (declare (optimize (speed 3)))
4              (cond
5                ((and (integerp x) (integerp y)) `(,f ,(+ x y)))
6                ((integerp x)
7                 (cond
8                   ((eq (car y) f)
9                    (cond
10                     ((integerp (cadr y)) `(,f ,(+ x (cadr y))
                        ,@(cddr y)))
11                     (t `(,f ,x ,@(cdr y)))))
12                   (t `(,f ,x ,y))))
13                ((integerp y)
14                 (cond
15                   ((eq (car x) f)
16                    (cond
17                     ((integerp (cadr x)) `(,f ,(+ y (cadr x))
                        ,@(cddr x)))
18                     (t `(,f ,y ,@(cdr x)))))
19                   (t `(,f ,y ,x))))
20                ((and (eq (car x) f) (eq (car y) f)) `(,f ,@(cdr x)
                   ,@(cdr y)))
21                ((eq (car x) f) `(,f ,@(cdr x) ,y))
22                ((eq (car y) f) `(,f ,@(cdr y) ,x))
23                (t `(,f ,y ,x)))))
23A      (or (cdr (find n *known-resistor-combinations* :key #'car
         :test #'=))
24       (if (= n 1)
25           (ncons (cons 1 1))
26           (let ((table (make-hash-table :test #'eql :size (* n
             (ash 1 n)))))
27             (declare (dynamic-extent table))
28             (loop
29               for i from 1 below n
30               do (loop
31                    for (x . xx) in
                      (series-parallel-values i)
32                    do
33                    (loop
34                      for (y . yy) in
                        (series-parallel-values (− n i))
35                      as s-form = (join 's xx yy)
36                      as p-form = (join 'p xx yy)
37                      do
38                      (setf (gethash (+ x y)
                         table) s-form)
39                      (setf (gethash (/ (+ (/ x) (/ y)))
                         table) p-form)))
40             finally
41             (let ((result nil))
42               (maphash #'(lambda (k v) (push (cons k v)
                 result)) table)
42A              (push (cons n result)
                 *known-resistor-combinations*)
43               (return result))))))))))
```

(In this example, the elements are resistors; as above, the formulas for series and parallel connections of inductors are the same as those for resistors, but the formulas for calculating series and parallel connections for capacitors are the opposite; the above code would thus need to be modified if the elements are capacitors.)

The program defines a main function "series-parallel-values" which creates combinations of repeated elements and has an optional argument n, the number of repeated elements to be used. The first part of the program listing above, lines 1-23, provides a function called "join" as a local function within the main function; the "join" function attempts to simplify expressions for the combinations that have been created by the main function. This will be explained further below.

The main function of the program begins by determining if the number of resistors to be used is one (see line 24 of the listing above). If the number of resistors is one, only one case is possible, and the program returns the degenerate case represented as a list of 1 combination.

If the number n of resistors to be used is other than one, as is likely to be the case, the program proceeds to find all combinations of n resistors. This is done, as explained above, by finding all combinations of resistors for all numbers less than n (the loop at line 31), and putting these combinations in all combinations of the remaining resistors (line 34). The value of each combination, again for a standard resistor having a unity value, is also determined. In this embodiment, due to its implementation in LISP, division operations on integers result in rational fractions, and consequently no rounding off of decimal places or error due to approximation is incurred.

Thus, again if n=4, then every combination of 1 element (again there is only one) is put in series and parallel with every combination of 3, 2 or 1 other elements. Next every combination of 2 elements is put in series and parallel with every combination of 2 elements and 1 elements. Then every combination of 3 elements is put and series and parallel with 1 element. Thus, every possible combination of the n elements will be created.

In seeking these combinations, the function "series-parallel-values" calling itself recursively, i.e., each time to determine the combinations for a lower number of resistors until the lower number is 1. In this embodiment, to optimize this recursive call and prevent redundant calculations, a data structure "known-resistor-combinations" is created. When the main function seeks to place elements in combination as described above, "known-resistor-combinations" is checked (line 23A) to determine whether the combination has already been created; if the combination has been previously created, then the function does not need to execute, but rather the previously created combination is retrieved from "known-resistor-combinations." If the combination has not been previously created, then the main function executes to create it and the result is saved in the "known-resistor-combinations" data structure (line 42A) for later look-up.

The use of a data structure such as "known-resistor-combinations" will increase the efficiency of the program by reducing the number of calculations needed by avoiding the recalculation of combinations that have been previously created. However, such a data structure is optional and not essential to the use of the method described herein.

The results of calculating all of the series and parallel combinations in this way are returned (after the notation has been simplified by the "join" function as explained below, see lines 35 and 36) and may be saved in, for example, a hash table (lines 38 and 39). The hash table may optionally be dynamically allocated (line 27); again, this is more efficient, but not necessary to the algorithm. In this embodiment, the hash table has a key equal to the rational fraction of the combination, i.e., the value of the algebraic expression representing the particular combination as explained above. These values are calculated at lines 38 and 39.

When all of the loops are complete, the hash table entries are collected and the keys and associated expressions for all combinations of n elements are compiled into a list and returned from the call to the "series-parallel-values" function. In addition, if the "known-resistor-combinations" data structure is used, it will contain all of the combinations of less than n elements, i.e., from one element to n−1 elements, as created by the loops of the "series-parallel-values" function.

In this embodiment, no value for the basic resistor is entered. Rather, it is assumed as above that the value of each resistor is unity. Thus, the table of combinations that is returned will contain a number of values representing the ratios of each combination to unity (or, in other terms, the effective resistance if each resistor has a value of 1Ω), and thus in the case of resistors the values will range from 1/n, i.e., n resistors in parallel, to n, i.e., n resistors in series.

Consider the example above where n=4. The resulting table will contain the following information:

| Decimal value | Exact fractional value | Description |
|---|---|---|
| 0.2500 | ¼ | (p4) |
| 0.4000 | ⅖ | (p2 (s2)) |
| 0.6000 | ⅗ | (p1 (s1 (p2))) |
| 0.7500 | ¾ | (p1 (s3)) |
| 1.0000 | 1 | (p (s2) (s2)) |
| 1.3333 | 4/3 | (s1 (p3)) |
| 1.6667 | 5/3 | (s1 (p1 (s2))) |
| 2.5000 | 5/2 | (s2 (p2)) |
| 4.0000 | 4 | (s4) |

Thus, the values in the table run from ¼, i.e., 1/n, representing 4 resistors of unity value in parallel ("p 4"), to 4, representing 4 resistors of unity value in series ("s 4"). The values in between these limits represent the other possible combinations of 4 resistors as indicated.

One of skill in the art will appreciate certain symmetries in the method described above that may be used to shorten the time needed to determine all of the possible combinations of n identical elements and calculate the values of those combinations. Using the example above where n=4, it will be understood first that combining 1 element with all combinations of the other 3 elements is the same as combining combinations of 3 elements with the other 1 element. Similarly, for n=16, combinations of 15 elements that are combined with the last element are the same as combinations of 1 element combined with combinations of the other 15. Thus, for any number n, and determining all combinations of 1, 3, etc., elements with all combinations of the remaining elements, it is only necessary to determine combinations up to n/2, as all combinations for n greater than n/2 will have already been determined. This "shortcut" is not implemented in the code example above.

In addition, as may be seen from the table for n=4 above, it will be seen that the value of the configuration in the first line is the inverse of the value of the configuration in the last line, the value of the second line is the inverse of the next to last line, and so on, except for the value of 1 in the middle line. It can also be seen that each configuration is the "inverse" of the configuration of the line having the inverse value, i.e., if one replaces each "p" with an "s" and replaces each "s" with a "p" the configuration of the line having the inverse value will be obtained. One of skill in the art may be able to use these two symmetries to write a program that requires less calculation, and thus is more efficient, than the LISP listing shown above.

One of the anticipated uses of the method described herein is to identify two combinations that may be used to build two (or more) components having values with an arbitrary ratio between them. It can be seen from the table above that ratios can be determined between the exact fractional values of each of the combinations of four resistors. Thus, the ratio between the values of the first configuration (p 4) and the second configuration (p 2 (s 2)) is ¼ to ⅖, which is 0.25 to 0.4, or 1 to 1.6. The ratio between the values of the first configuration and the last configuration (s 4) is ¼ to 4, or 1 to 1.6. Similarly, the ratios between any other pair of two configurations in the table may be calculated.

Thus, for example, suppose a designer wants to have two resistive components with values of 375Ω and 833.33Ω, a ratio of 1 to 2.2222. When all of the ratios between pairs of configurations in the table above for four resistors are calculated, it will be found that the ratio between two of the configurations is 1 to 2.2222.

The 4$^{th}$ entry in the table above for four resistors has a configuration of (p 1 (s 3)), i.e., three resistors in series, and that series in parallel with the fourth resistor, and a value of ¾ or 0.75 when the resistor value is unity. The 7th entry in the table has a configuration of (s 1 (p 1 (s 2))), i.e., two resistors in series, that series in parallel with a third resistor, and that combination in series with the fourth resistor, and a value of 5/3 or 1.6667. The ratio between these two configurations (the 4th and 7th entries in the table) is the ratio of their values as shown in the table when the resistor value is unity, i.e., 0.75 to 1.6667, or 1 to 2.2222. Thus, building resistance values in these configurations will maintain the ratio of 0.75 to 1.6667, or 1 to 2.2222, regardless of the value of the basic resistor element, and regardless of variations in the manufacturing process.

The basic repeated resistor can be built to any size (within some practical limits), depending upon the actual values that are desired for the two combination resistors. Since the first combination resistor value is to be 375Ω in this example, then the nominal value of the repeated resistor may be determined by dividing the desired value of 375Ω by the value of the second combination (at unity resistor value) of 0.75, resulting in a nominal value of 500Ω. Thus, making the repeated resistor with a nominal value of 500Ω will result in the first combination having an expected value of 375Ω, i.e., 0.75 times 500Ω. The second combination will have an expected value of 1.667 times 500Ω, or 833.33Ω, or 2.2222 times 375Ω, as desired. As above, if the manufacturing process causes variations in the value of the basic resistor, such that its value differs from the nominal value of 500Ω, the ratio between the two combinations will remain at 2.2222.

The table above for four resistors has nine possible configurations. It is thus possible to create 81 pairings, although nine of these will be pairing a configuration with itself, and some pairings may have the same values as other pairings. It will thus be seen that as the number of elements in a combination increases, not only does the number of possible combinations increase rapidly, but the number of possible ratios increases even faster.

For example, the use of 16 elements results in approximately 600,000 possible combinations as above; that number of combinations will result in approximately 360 billion possible pairings. In most cases, it will thus be most efficient both to have a processor or other computing device determine all of the possible combinations, as for example by the code above, and to have the computing device determine the ratios between the combinations and identify combinations that provide the ratio(s) desired by the designer between components.

In this way it is possible to perform matching of two components having values of an arbitrary ratio to an extreme degree of precision. In one example above, it was shown that an error of 0.1 micron in manufacturing lengths and widths on the order of 1 to 20 microns could result in a change in the ratio of the values of two components of a significant fraction of one percent. Using the method described herein, the ratio of the values of two components can easily be made accurate to within a part per million.

For example, suppose that it is desired to create two resistor values, one having a resistance of 2 kΩ and the other of 2.001 kΩ, and to have the values match to within 5 parts per million. This will be extremely difficult to do with conventional manufacturing techniques which only adjust the area of the resistors for the reasons shown above.

However, again suppose 16 resistors are used, A computing device can determine the 600,000 possible combinations of 16 resistors mentioned above, calculate the value of each such combination, and then calculate the ratio between each pair of such combinations and identify the two combinations whose ratio is the closest to 2001 to 2000. In fact, in such a case the computing device will find that the closest ratio is between two combinations having values, in rational fractions as above, of 14/3 and 667/143. It can be confirmed algebraically that the ratio between these two values reduces in whole numbers to 2002/2001, or in decimal terms to 2000.99950 to 2000, an error of less than 0.250 parts per million (ppm) from the desired ratio of 2001/2000. The two identified expressions are:

(s4(p1(s1(p(s2)(s1(p(s2)(s1(p(s2)(s2)

and (s4(p(p1(s2))(p2(s(p2)(p3))))))

Again, by using the formulas above for series and parallel connections of resistors, it can be confirmed that the value of the first expression for a resistor of unity value is 14/3, and the value of the second expression is 667/143.
Thus, by following this process the computing device can determine that using these two combinations to construct the two resistor values of 2 kΩ and 2.001 kΩ will result in a constant ratio that is well thin the desired margin of error of the intended ratio.

Returning to the fractional values of these expressions, as explained above, in order to obtain the desired resistance of 2001Ω from the first combination, the nominal value of the repeated resistors should be the desired value of 2001Ω divided by the value of the first combination (at unity resistor value) of 14/3. Dividing 2001Ω by 14/3 results in a nominal value for the repeated resistors of 428.786Ω; this calculation may also be done by the computing device if desired. Thus, making the two combinations from 16 resistors each, each resistor with a nominal value of 428.786Ω, will result in the desired values of 2 kΩ (i.e., 428.786*667/143) for the second combination and 2.001 kΩ (i.e. 428.786*14/3) for the first combination.

This level of precision is made possible by the fact that there are, as above, approximately 180 billion different ways to match two resistance values that are each made from 16 identical elements in this way. More elements may be used if necessary, and thus almost any level of accuracy may be obtained in this fashion.

The "join" function will now be explained. As above, the expression:

(s(s4)(s2(p3)))

may be simplified to:

(s6(p3))

In some cases, it is also possible to simplify expressions of elements in parallel.

While simplifying expressions is not necessary to operation and use of the described method, it can make the expressions easier for a designer to read if that is desirable. For this reason, in one embodiment the program includes a constructor that puts two expressions in series or parallel also seeks to simplify the resulting expression. As above, each expression may itself be a combination of two expressions in series or parallel. In one embodiment, this constructor, called a "join" function, is defined as shown by lines 1-23 of the code in the main function "series-parallel-values" above.

One skilled in the art will see that the "join" function expects to see three arguments. The first argument is "s" or "p," the second argument is the first data structure, and the third argument is the second data structure. Note that the second and third arguments may themselves be expressions that begin with "s"

Some examples may help to clarify the operation of the program shown above. In this embodiment, the "join" function first determines if both the second and third arguments are actually just integers (line 5 in the listing above). If so, the program simplifies the expression to a list of two elements that is just the first argument operator operating on the sum of the integers. Thus, the operation "(join's 3 4)," in which the second argument is 3 and the third argument is 4, is simplified by having the first argument, operator "s," operate on the sum of the integers. This results in "(s 7)." (In the expression "(join's 3 4)," the apostrophe before "s" is used in LISP to indicate that the item after the apostrophe is to be treated as data, rather than as an executable operator.)

Next, the program determines whether either the second argument (lines 6-12) or the third argument (lines 13-19) is an integer, and, if so, attempts a simplification. More specifically, if one of these arguments is an integer, the algorithm checks to see if the other argument begins with the same function as it is attempting to join (lines 8 and 15).

If the other argument does not begin with the same function, then no simplification is possible and the straightforward combination of the function and the two arguments is returned. For example, in the expression:

(join's3'(p4))

while the second argument is an integer, the third argument, "(p 4)," does not begin with the same function "s," and thus cannot be simplified, so the program simply returns the same expression "(s 3 (p 4))."

On the other hand, if the third argument does begin with the same function as the one it is attempting to join, then the program determines whether the first argument to that same function is an integer (line 10), and, if so, constructs and returns a modified call to the same function in the third argument where the argument of the same function is incremented by the first integer argument. Thus, for example, in the expression:

(join 's4'(s4(p5)))

the third argument "(s 4 (p 5))" begins with the same function "s" as the first argument "s" and has an integer for its first argument, so the program returns a modified call to the same "s" function, incremented by the "4" to which the first argument "s" function applies, and thus is simplified to:

(s8(p5))

If the third argument begins with the same function but the argument to that same function is not an integer, simplification may still be possible by just adding the integer argument from the first argument to the same function of the third argument it is seeking to join (line 11). Thus, in the expression:

(join 's4'(s(p3)(s3)))

the third argument "(s (p 3) (s 3))" begins with the same function "s" as the first argument, but the third argument does not merely operate on an integer, but rather on another function. However, the argument to the first function may be added to the second "s" function, resulting in:

(s4(p3)(s3))

A similar series of steps to those described above is taken when the third argument considered to be joined is an integer (lines 13-19).

If neither argument to be joined is an integer, the program determines whether the two elements to be joined have the same function (line 20). If they do, the program constructs a call to the common function with a concatenation of the two sets of arguments (line 20, second part). Thus:

(join 'p'(p(s9))'(s5)(s2)))

results in:

(p(s9)(s5)(s2))

If the two elements to be joined, i.e., the second and third arguments, do not have the same function, the program determines whether the first argument is the same function as the one it is trying to join (line 21); if so, it simply appends the operand of the second argument to the argument list of the first argument function. A similar condition is sought for the third argument (line 22). Thus:

(join 'p'(p3)'(s3))

has a second argument "(p 3)" with the same function as the first argument "p," so the operand "3" of the second argument is added to the argument list of the first argument "p" and results in:

(p3(s3))

If none of these cases apply, the algorithm simply returns the three arguments (line 23). Thus:

(join 'p'(S2)'(s5))

cannot be simplified by any of the above steps, so the program simply returns:

(p(s2)(s5))

In addition to the evaluation of expressions during the determination of all possible expressions, it is useful in some cases to be able to find the value of a single expression. In one embodiment, an evaluator for the algebra of "s" and "p" may be defined in a LISP routine here called "evaluate-sp-expression" as follows:

```
(defun evaluate-sp-expression (form)
    (labels ((sp-eval
                (form in-context)
              (etypecacase form
                (cons
                  (ecase (car form)
                    (s (loop for x in (cdr form) sum (sp-eval x 's)))
                    (p (/ (loop for x in (cdr form) sum (/ (sp-eval
                          x 'p)))))))
                (integer
                  (ecase in-context
                    (s form)
                    (p (/ form))))))))
      (sp-eval form 's)))
```

This evaluator expects the expression to consist of the symbols "s" or "p," an integer, or another expression on which the evaluator is to operate recursively. Thus, considered as code, the operands of the "s" and "p" operators are either other expressions of "s" and "p" or non-zero cardinal numbers representing the number of repeated elements to which the operator is to be applied.

Evaluation of the expression "(s 2 (p 3)Y" representing the combination of FIG. 4 results in the rational number 7/3. It may be seen that this is the same result as is obtained by setting the value of each resistor to 1, and using the formulas above for series and parallel resistance, since the total resistance $R_T$ of the combination of FIG. 4 is given by:

$$R_T = R + R + \frac{1}{\left(\frac{1}{R} + \frac{1}{R} + \frac{1}{R}\right)}$$

which is again equal to 7/3 where each R is equal to 1. Note that the "s" and "p" operators operate upon and return rational numbers, so that exact results are provided and no approximation is involved.

Figure 5:
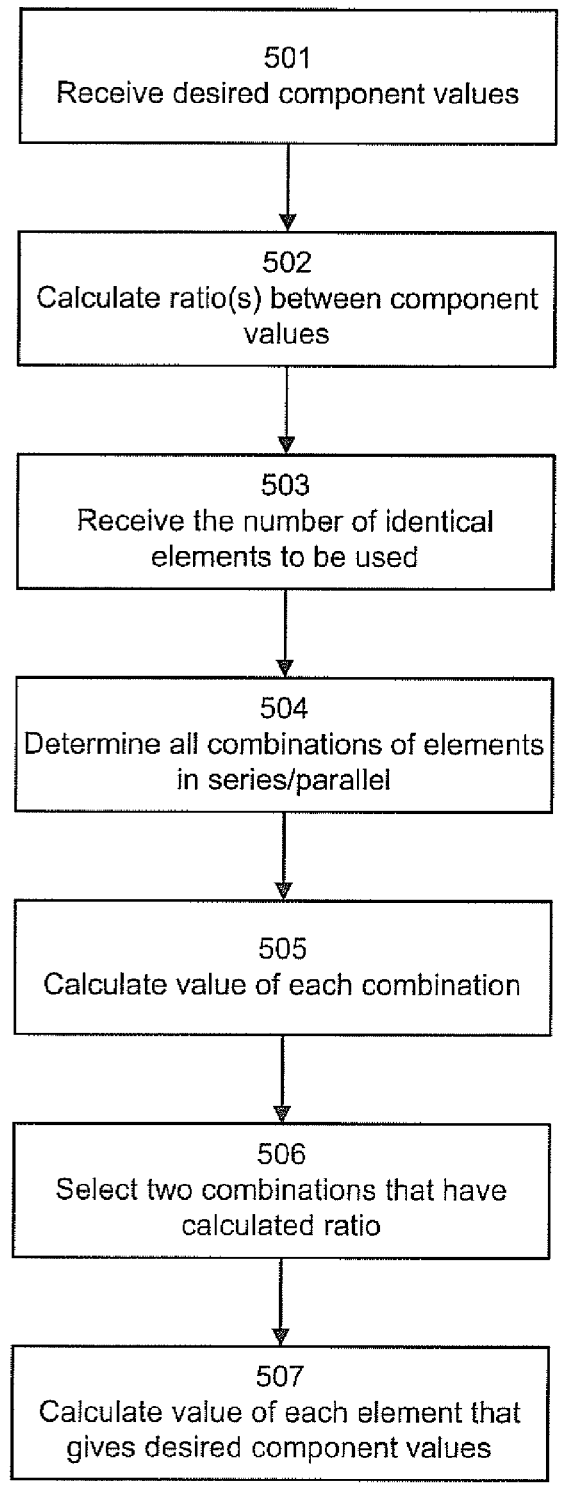
FIG. 5 is a flowchart illustrating one possible embodiment of a method as described herein embodied in software.

FIG. 5 is a flowchart illustrating one embodiment for implementing on a computing device the method described herein for designing two semiconductor circuit components having particular nominal values, where the ratio of the two values is desired to remain constant even if the actual values differ from the nominal values. The steps shown are performed by software; for example, some of the steps shown may be performed by the LISP listing above.

At step 501, the computing device receives an input indicating the desired values that have been determined, for example by a circuit designer, for at least a first and a second component to be built on the semiconductor chip. At step 502, the ratio between the two values is calculated by the computing device.

At step 503, the computing device also receives an input indicating the number n of identical elements that is to be used to construct the first and second components. Again, this will typically be determined by the designer of the circuit based upon various considerations. For example, as above, the more repeated identical resistors that are used, the more combinations are possible, and the greater the level of accuracy that may be achieved. In the example of 16 resistors above, again over 600,000 combinations are possible, and thus over 360 billion possible pairs of combinations; it is expected that this number of pairs should allow for accuracy to well under one part per million as in the example above. On the other hand, more resistors take up more space, which may be limited on the chip. A designer skilled in the art will be able to weigh this tradeoff in a particular instance.

At step 504, all of the possible series and/or parallel combinations of the n identical elements are automatically determined by the computing device, for example by running an algorithm such as that shown above. Next, at step 505 the value of each combination is calculated using the formulas for series and parallel connections as described above, assuming that the value of each identical element is unity, and the results stored in a data structure.

At step 506, as described above two combinations having the same ratio between their values as the ratio between the desired values of the components are selected. At step 507, as also explained above, a nominal value is calculated for the identical elements that, when multiplied by the values of the selected combinations, results in the desired component values as explained above.

In many situations, there will be more than two components in a design between which it will be desirable to keep the ratios constant, for example as shown in FIG. 3. In such cases, more than two combinations will be selected, with the values of those combinations (again at unity resistor value) selected such that all of the desired components will maintain their respective ratios with respect to each other as closely as possible.

One way to measure how closely the components match the desired values is to calculate the root mean square deviation of the values of the selected combinations from the desired values. For example, the root mean square error of the absolute differences of the component values from the desired values may be calculated. Alternatively, the root mean square error of the percentage differences of the component values as compared to the desired values may be calculated. Other criteria will be apparent to those of skill in the art; a designer may select the criteria believed to be the most appropriate for a given situation. In any event, in order to perform such a calculation, a set of components must be selected, i.e., a complete set of combinations must be identified in some fashion.

One way to identify a potential set of combinations is to first determine how to construct two components as described above, and then attempt to add further components one by one. In each case a combination for each further component is sought that will maintain the desired ratio to the already designed components, given the nominal value of the repeated identical elements that has already been determined as above.

This method has the limitation that the range of values that may be constructed will be constrained by the previously-determined nominal value of the repeated identical elements, and thus in effect by the selection of the first two components to be designed in the way described. As previously explained, a combination of n identical resistors can create resistance values ranging from 1/n times the nominal value of the identical resistors (for n resistors all in parallel) to n times the nominal value (for n resistors all in series).

Thus, in the example above, if 16 identical resistors are to be used in each combination, and the first two combinations selected are for resistance values of 2000Ω and 2001Ω, the nominal value of the repeated resistors will be 428.786Ω. As a result, if these two combinations are then regarded as fixed, any other combinations to be added will be limited to the combinations of 16 identical resistors of 428.786Ω each. Such combinations will be able to make, with reasonable accuracy, resistance values nominally ranging from 428.786 divided by 16, or approximately 26.8Ω, to 428.786 times 16, or 6860.576Ω.

If only combinations of 16 such resistors are used, d these low and high values will have to be used for desired values outside of this range; for example, a desired value of 10 (or any other desired value less than 26.8Ω) will be represented by the combination providing a resistance of 26.8Ω, and a desired value of 100 kΩ (or any other desired value greater than 6860.576Ω) will be represented by the combination providing a resistance of 6860.576Ω The difference between these values and the desired values will thus contribute to the error as calculated by the root mean square calculation above.

It will thus also be seen that the range of actual values that may be accurately made depends on the nominal value of the identical resistors; if the nominal value of the identical resistors is selected as 1Ω, the combinations will range in actual value from $\frac{1}{16}$Ω (0.0625Ω) to 16Ω, while if the nominal value of the identical resistors is 1000Ω, the combinations will range in actual value from 62.5Ω to 16,000Ω (16 kΩ).

Given this limitation created by the initial determination of the nominal value of the repeated identical resistors, the identification of the first two combinations may result in a nominal value being selected that is not well suited for use in combinations to create the other desired resistance values. Thus, rather than first identifying two combinations which result in the determination of the nominal value of the identical resistors, it may be preferable to first identify that nominal value.

One way to do this is to select the nominal value of the repeated identical resistors as some average of the desired component values. One might, as a first estimate, try taking the arithmetic mean, or average, by simply adding up the desired component values and dividing by the number of such values.

A limitation of this simple approach will quickly become apparent, however. Suppose there are three desired component values, the first two of which are 100 kΩ, and the third of which is 1 kΩ. The average of these three values is 201 kΩ divided by three, or 67 kΩ. While a 100 kΩ, resistance may be constructed of a combination of 16 resistors of 67 kΩ each, the lowest resistance that may be obtained from such a combination is by placing all of the resistors in parallel, resulting in a resistance of 67 kΩ, divided by 16, or 4.1875 kΩ. The difference in the ratio of a 4.1875 kΩ resistance to another value as compared to the ratio of the desired value of 1 kΩ to the other value will add a significant error in the root mean square calculation.

It is believed that a better way to "average" the desired resistance values is to take the logarithm of each value, take the average of the logarithms, and set the nominal resistance of the identical resistors at the value which has that average as its logarithm. Thus, in the example immediately above, the logarithm (base 10) of 100,000 is 5 (there are two of these as above), and the logarithm of 1000 is 3, making the sum of the logarithms of the three values 13. The average logarithm of the three values is thus 13 divided by 3, or 4.333, and 10 raised to the power of 4.333 is 21.544 kΩ.

Thus, using this method, the nominal value of each repeated identical resistor is 21.544 kΩ, rather than the 67 kΩ of the simpler method above. It can be seen that the desired value of 100 kΩ is well within 16 times 21.544 kΩ, while the lowest value that can be made from 16 such resistors is 21.544 kΩ divided by 16 (again, all 16 resistors in parallel) or 1.3465 kΩ. While 1.3465 kΩ is still greater than the desired value of 1.1 kΩ, it is significantly closer than the 4.1875 kΩ obtained with the simpler method, and thus will result in a significantly lower root mean square error.

As in this example, the nominal value for the repeated resistors obtained by using the average of the logarithms of the desired values should generally be lower than the nominal value that will be obtained by merely averaging the desired values. Also as in this example, a lower nominal value for the repeated resistors will allow a combination to more closely approximate smaller resistance values in a desired set while still maintaining the ability to construct the larger resistance values in the set.

Once the nominal value of the repeated resistors is selected, an appropriate combination to be used for each component is identified by dividing the desired value of the component by that nominal value, and then identifying the combination that has the closest value (at sanity value, i.e., a 1Ω resistor) to that result. Thus, in the example above, to construct a 100 kΩ resistance from 16 resistors each having a nominal value of 21.544 kΩ, a combination having a value at unity of 100,000 divided by 21,544, or 4.6417, should be selected.

As a practical matter, while a circuit designer may wish to choose the combinations that provide the closest matches to the desired values in this fashion, it may be simpler to program a computing device to identify combinations. This may be done by programming the computing device to assign combinations to each value and compute the root mean square error of the absolute or percentage differences in the values as above. The computing device may then alter the assigned combinations and again compute the root mean square error, repeating the process until either a set of combinations within a desired margin of error is obtained, or the minimum possible margin of error is obtained. If other criteria than the root mean square are used, the computing device may be programmed to perform such calculations as are appropriate to identify the set of combinations that most closely meets the desired values for the components.

In one embodiment, the computing device may sequentially identify all possible sets of combinations, starting with an arbitrary set of combinations, and identify the set having the smallest root mean square error. In an alternative embodiment, for each desired value of a component, the computing device may use the table of the values of the combinations described above to identify some limited number of combinations whose values, when multiplied by the nominal value of the repeated resistors, will result in a value close to the desired value of the component, and then compute the root mean square error of all sets of those limited numbers of combinations, again selecting the set with the smallest error.

In still another embodiment, the computing device may identify a set of combinations and compute the root mean square error, and then vary only the combination assigned to a first desired value, keeping the combinations assigned to the other desired values fixed, until the combination assigned to the first desired value that results in the smallest error is identified. The computing device then similarly varies the combination assigned to the second desired value while keeping the other combinations fixed until the combination assigned to the second desired value leading to the smallest error is identified. The computing device similarly identifies a combination for each desired value that results in the smallest root mean square error, until a combination has s been identified for each desired value.

Figure 6:
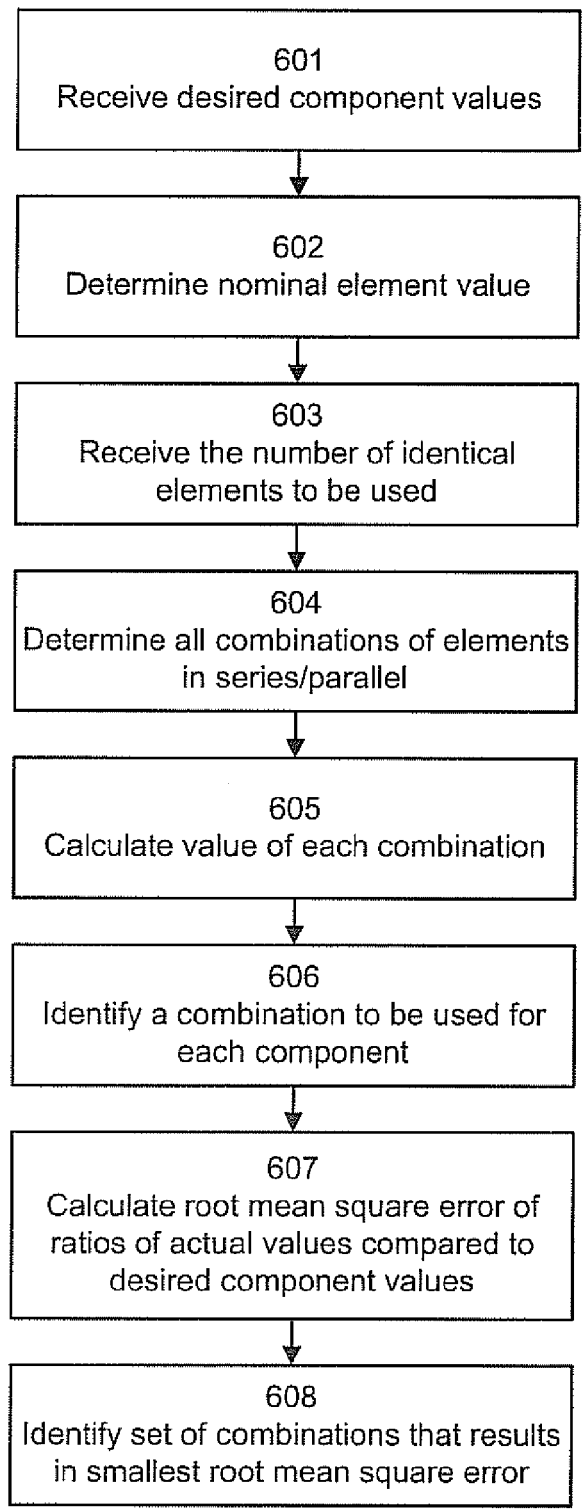
FIG. 6 is a flowchart illustrating an alternative embodiment of a method as described herein embodied in software.

FIG. 6 is a flowchart illustrating one embodiment for implementing on a computing device the method described above for designing a plurality of semiconductor circuit components having particular nominal values, again where the ratios of the component values are desired to remain constant even if the actual values differ from the nominal values. The steps shown are again performed by software; for example, some of the steps shown may be performed by the LISP listing above.

At step 601, the computing device receives input indicating the desired values that have been determined, for example by a circuit designer, for a plurality of components to be built on the semiconductor chip. At step 602, a nominal value is determined for the repeated identical elements as described above, for example by taking the average of the logarithms of the desired values.

At step 603, the computing device also receives an input indicating the number n of identical elements that is to be used to construct each of the plurality of components. Again, this will typically be determined by the designer of the circuit.

At step 604, all of the possible series and/or parallel combinations of the n identical elements are again automatically determined by the computing device, for example by running an algorithm such as that shown above. Next, at step 605 the value of each combination is calculated using the formulas for series and parallel connections as described above, again assuming that the value of each identical element is unity, and the results stored.

At step 606 combinations are identified for each desired value. As above, the computing device may attempt to identify a combination for each component that will result in a value that is close to the desired value of the component, or may initially identify an arbitrary set of combinations.

At step 607, the root mean square error of the ratios of the actual values of the set of combinations to a reference value, compared to the ratios of the desired values to the reference value, is determined. If the root mean square error is within a desired margin of error, the program may output the identified combinations and terminate.

Alternatively, the program may continue to check whether another set of combinations may be identified that has a smaller root mean square error, and identify the set of combinations with the smallest root mean square error at step 608. As above, this may be done either by checking all possible sets of combinations, or by seeking, for each desired value in sequence, the combination that gives the smallest root mean square error before proceeding to seek a combination for the next desired value.

It will be apparent that some of these steps may be placed in a different order without changing the outcome of the process. For example, receiving the number of identical resistors, determining all combinations of that number of resistors, and calculating, the value of each combination at unit resistor value may all be done before the desired component values are received and the nominal value of the identical resistors is determined. One of skill in the art will be able to determine other orders of these steps that are possible without changing the outcome of the process.

One of skill in the art will appreciate that other embodiments of the method are possible. For example, as noted above, when more repeated elements of identical nominal value are used, the ratio of two (or more) combinations made from those elements to each other is less likely to vary due to variations in the manufacturing process. For this reason it is expected that it will generally be preferable to have the combinations contain the same number of repeated identical elements, even when a desired value may be expressed by a simpler combination. Thus, while it may be possible, and even advantageous due to space considerations, to construct one component having a desired value as a combination of fewer identical elements than another component, or in some cases even as a single element, this runs a risk that the ratio between the component values will vary more than if the same number of elements is used in each combination as explained above.

One possible use of the method described herein is in designing a tapped delay line filter, a type of finite impulse response (FIR) filter which may be used, for example, to provide a desired frequency response to an input signal. The output of such a filter is a weighted combination of voltages taken from uniformly spaced taps, the weights provided by resistors connected to the delay line at various points. The accuracy of such filters depends heavily upon the ratio of the weights, i.e., the resistor values. Those of skill in the art will also see numerous other potential applications of the present invention.

The disclosed system and method has been explained above with reference to several embodiments. Other embodiments will be apparent to those skilled in the art in light of this disclosure. Certain aspects of the described method and apparatus may readily be implemented using configurations or steps other than those described in the embodiments above, or in conjunction with elements other than or in addition to those described above.

For example, while resistors have been used for ease of illustration, as noted above inductors and capacitors follow identical or similar rules of calculating values for series and/or parallel connections, and those components may also be implemented using the techniques described herein, again as long as the formulas used to calculate the values of series and parallel connections are adjusted as noted above.

It should also be appreciated that the described method and apparatus can be implemented in numerous ways, including as a process, an apparatus, or a system. The methods described herein may be implemented by program instructions for instructing a processor to perform such methods, and such instructions recorded on a computer readable storage medium such as a hard disk drive, floppy disk, optical disc such as a compact disc (CD) or digital versatile disc (MD), flash memory, etc. The methods may also be incorporated into hard-wired logic if desired. It should be noted that the order of the steps of the methods described herein may be altered and still be within the scope of the disclosure.

These and other variations upon the embodiments are intended to be covered by the present disclosure, which is limited only by the appended claims.

What is claimed is:

1. A method of designing semiconductor circuit components having nominal values in a desired ratio to each other, each component constructed as a combination of a number of repeated identical elements, comprising:
   receiving as an input at a computing device a first desired value for a first component and a second desired value for a second component;
   calculating by the computing device the ratio between the desired values for the first component and the second component;
   receiving as an input at the computing device the number of repeated identical elements to be used in each component;
   determining by the computing device the possible combinations of series and parallel connections of the received number of repeated identical elements;
   calculating by the computing device a value for each combination based upon a unity value for the repeated identical elements;
   identifying by the computing device two combinations from the determined combinations that have the desired ratio between the determined values; and
   calculating an actual value for the repeated identical elements that, when multiplied by the calculated values of the selected two combinations, results in the received values for the first component and the second component.

2. The method of claim 1, wherein determining by the computing device the possible combinations of series and parallel connections of the selected number of repeated identical elements further comprises recursively determining the possible combinations of series and parallel connections of numbers of identical elements from 1 up to the received number of repeated identical elements.

3. The method of claim 1, wherein the repeated identical elements are elements having impedance.

4. The method of claim 3, wherein the repeated identical elements are resistors.

5. The method of claim 3, wherein the repeated identical elements are inductors.

6. The method of claim 3, wherein the repeated identical elements are capacitors.

7. The method of claim 1, further comprising outputting from the computing device the identified two combinations and the calculated actual value of the repeated identical elements.

8. A method of designing semiconductor circuit components having nominal values in a desired ratio to each other, each component constructed as a combination of a number of repeated identical elements, comprising:
   receiving as an input at a computing device a first desired value for a first component and a second desired value for a second component;
   calculating by the computing device the ratio between the desired values for the first component and the second component;
   receiving as an input at the computing device a first element value indicating the number of repeated identical elements to be used in the first component and a second element value indicating the number of repeated identical elements to be used in the second component;
   determining by the computing device the possible combinations of series and parallel connections of the number of repeated identical elements of the first element value and the number of repeated identical elements of the second element value;
   calculating by the computing device a value for each combination based upon a unity value for the repeated identical elements;
   identifying by the computing device a combination for the first component from the determined combinations of the first element value and a combination for the second component from the determined combinations of the second element value, such that the combination for the first component and the combination for the second component have the desired ratio between the determined values; and
   calculating an actual value for the repeated identical elements that, when multiplied by the calculated values of the selected two combinations, results in the received values for the first component and the second component.

9. A method of designing semiconductor circuit components having nominal values in a desired ratio to each other, each component constructed as a combination of a number of repeated identical elements, comprising:
   receiving as an input at a computing device a plurality n of values for the circuit components and a desired maximum margin of error;

determining by the computing device, from the plurality of values received for the circuit components, a nominal value for the repeated identical elements;

receiving as an input at the computing device the number of repeated identical elements to be used in each component;

determining by the computing device the possible combinations of series and parallel connections of the received number of repeated identical elements;

calculating by the computing device a value for each combination based upon a unity value for the repeated identical elements;

selecting by the computing device a set of one or more combinations as an initial assumption of the combinations to be used to construct the desired components;

calculating by the computing device the root mean square error between the ratios of the values of the set of selected combinations and the ratios of the desired values of the components;

repeatedly replacing by the computing device one or more of the selected combinations with other combinations to create a new set of selected combinations and calculating the root mean square error between the values of the new set of selected combinations and the desired values of the components; and identifying by the computing device a set of combinations for which the root mean square error is either within the desired maximum margin of error or the lowest error that can be found.

10. A system for designing semiconductor circuit components having nominal values in a desired ratio to each other, each component constructed as a combination of a number of repeated identical elements, comprising:

input means for receiving a first desired value for a first component and a second desired value for a second component and receiving as an input the number of identical elements to be used in each component;

a processor configured to:
calculate the ratio between the desired values for the first component and the second component;
determine the possible combinations of series and parallel connections of the selected number of repeated identical elements;
calculate a value for each combination based upon a unity value for the repeated identical elements;
identify two combinations from the determined combinations that have the desired ratio between the determined values; and
calculate an actual value for the repeated identical elements that, when multiplied by the calculated values of the selected two combinations, results in the received values for the first component and the second component;

a memory for storing data representing each of the determined combinations of repeated identical elements and the value of each combination; and output means for outputting the identified two combinations and calculated actual value of the identical elements.

11. The system of claim 10 wherein the processor is further configured to determine the possible combinations of series and parallel connections of the selected number of identical elements by recursively determining all possible combinations of series and parallel connections of numbers of repeated identical elements from 1 up to the received number of identical elements.

12. The system of claim 10 wherein the number of repeated identical elements to be used in the first component is the same as the number of repeated identical elements to be used in the second component.

13. The system of claim 10 wherein the number of repeated identical elements to be used in the first component is different from the number of repeated identical elements to be used in the second component.

14. The system of claim 11 wherein the memory further stores data representing the combinations of numbers of repeated identical elements less than the received number.

15. The system of claim 10, wherein the repeated identical elements are elements having impedance.

16. The system of claim 15, wherein the repeated identical elements are resistors.

17. The system of claim 15, wherein the repeated identical elements are inductors.

18. The system of claim 15, wherein the repeated identical elements are capacitors.

19. A non-transitory computer readable storage medium having embodied thereon instructions for causing a computing device to execute a method of designing semiconductor circuit components having nominal values in a desired ratio to each other, each component constructed as a combination of a number of repeated identical elements, the method comprising:

receiving as an input at a computing device a first desired value for a first component and a second desired value for a second component;

calculating by the computing device the ratio between the desired values for the first component and the second component;

receiving as an input at the computing device the number of repeated identical elements to be used in each component;

determining by the computing device the possible combinations of series and parallel connections of the received number of repeated identical elements;

calculating by the computing device a value for each combination based upon a unity value for the repeated identical elements;

identifying by the computing device two combinations from the determined combinations that have the desired ratio between the determined values; and calculating an actual value for the repeated identical elements that, when multiplied by the calculated values of the selected two combinations, results in the received values for the first component and the second component.

* * * * *